United States Patent
Schlereth

(10) Patent No.: US 6,538,302 B1
(45) Date of Patent: Mar. 25, 2003

(54) SEMICONDUCTOR CHIP AND METHOD FOR THE PRODUCTION THEREOF

(75) Inventor: Karl-Heinz Schlereth, Burglengenfeld (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 09/623,622
(22) PCT Filed: Jan. 4, 2000
(86) PCT No.: PCT/DE00/00036
§ 371 (c)(1), (2), (4) Date: Dec. 13, 2000
(87) PCT Pub. No.: WO00/41280
PCT Pub. Date: Jul. 13, 2000

(30) Foreign Application Priority Data

Jan. 4, 1999 (DE) .......................... 199 00 052

(51) Int. Cl.$^7$ ............................. H01L 23/544
(52) U.S. Cl. .................. 257/620; 257/94; 257/710; 438/14
(58) Field of Search ............... 257/94, 710, 620; 438/14; 372/43; 428/156

(56) References Cited

U.S. PATENT DOCUMENTS

| | | | | |
|---|---|---|---|---|
| 5,198,686 A | * | 3/1993 | Yoshimura .................. | 257/94 |
| 5,618,380 A | * | 4/1997 | Siems et al. ................ | 438/14 |
| 5,898,218 A | * | 4/1999 | Hirose et al. ............... | 257/710 |
| 5,929,509 A | * | 7/1999 | Shen et al. .................. | 257/620 |
| 6,181,720 B1 | * | 1/2001 | Kanemoto et al. .......... | 372/43 |
| 6,214,441 B1 | * | 4/2001 | Liu et al. .................... | 428/156 |

FOREIGN PATENT DOCUMENTS

| | | |
|---|---|---|
| DE | 74 226 13 | 10/1974 |
| DE | 27 00 463 A1 | 7/1978 |
| DE | 37 43 044 A1 | 6/1989 |
| EP | 0 022 956 A1 | 1/1981 |
| EP | 0 108 910 B1 | 5/1984 |
| FR | 2 687 857 A1 | 8/1993 |
| JP | 59 088 877 | 5/1984 |

OTHER PUBLICATIONS

Völz, H.: "Elektronik" [Electronic], Akademie–Verlag, vol. 4, 1986, p. 230.
Beneking H.: "Halbleiter–Technologie" [Semiconductor Technology], B. G. Teubner, 1991, p.p. 408–409.

* cited by examiner

Primary Examiner—David Nelms
Assistant Examiner—Mai-Huong Tran
(74) Attorney, Agent, or Firm—Laurence A. Greenberg; Werner H. Stemer; Gregory L. Mayback

(57) ABSTRACT

The invention relates to a semiconductor chip having a fracture sidewall (4) running at a lateral edge region, and having an electrically active layer (2) ending at the fracture sidewall, in which case at least one fracture-sidewall section which is assigned to the end of the active layer is provided with a passivation layer (10) covering said section. The invention furthermore relates to a method for fabricating such a semiconductor chip.

20 Claims, 2 Drawing Sheets

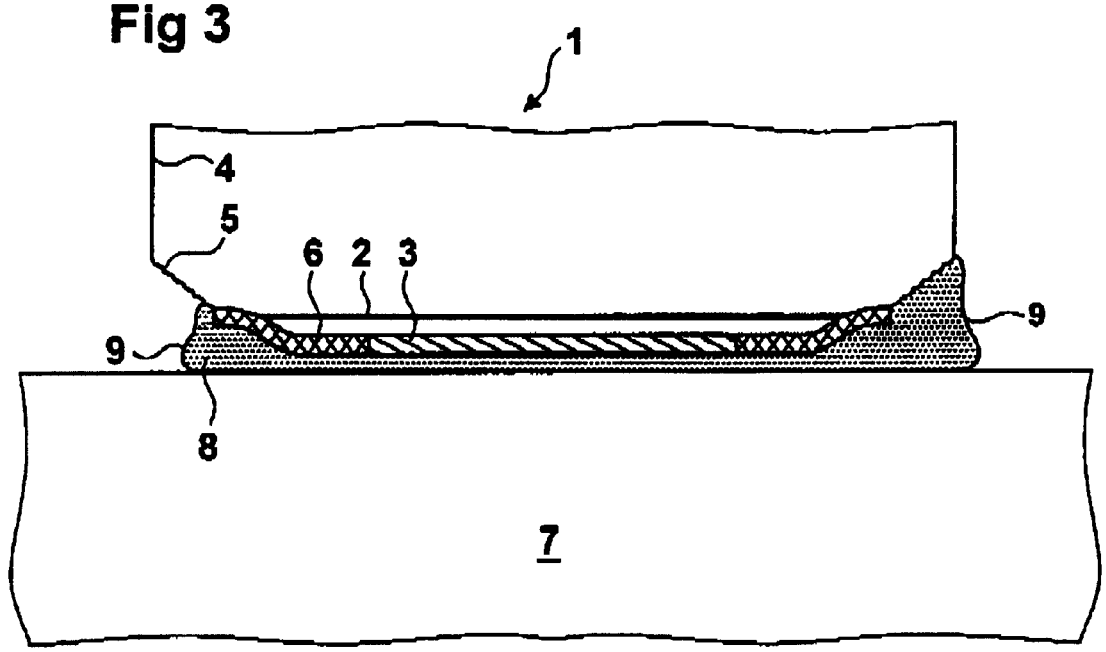

SEMICONDUCTOR CHIP AND METHOD FOR THE PRODUCTION THEREOF

BACKGROUND OF THE INVENTION

Field of the Invention

The invention relates to a semiconductor chip having a fracture sidewall running at a lateral edge region, and having an electrically active layer ending at the fracture sidewall. The invention furthermore relates to a method for fabricating such a semiconductor chip.

In semiconductor technology, semiconductor chips are fabricated in mass production in the so-called wafer composite. The finished individual semiconductor chips are then separated from one another. This is done by sawing or scribing and breaking along the resulting scribed track. In both cases, active layers running parallel to the surface of the semiconductor chip may end at these sawing or fracture sidewalls and thus be accessible.

It is often necessary to solder a semiconductor chip directly to a conductor. Added to this, specifically in the case of semiconductor laser chips (in particular in the case of so-called linear arrays of high-power lasers), is the fact that in these optoelectronic components, the active side (pn junction) must be mounted facing down (p-down mounting) in order to realize a voltage supply and/or a thermal heat dissipation. The spatial proximity of the active layer of the semiconductor laser chip to a contact area results here from the necessity of pumping the active layer and/or of dissipating the heat produced in the active layer. The active layer is thus situated directly over the contact layer arranged on the lower side. If such a component is then connected to a conductor, short circuits due to solder which touches the lateral fracture sidewall, and thus the active layer ending at the fracture sidewall, cannot be precluded, which can lead to the failure of the component.

The structure of a previous semiconductor laser chip is illustrated with reference to FIG. 2. A semiconductor chip 1 can be seen which has an active layer 2 formed in the semiconductor substrate, which active layer is assigned a contact area 3 and ends laterally at the side of the fracture sidewall 4. The active layer 2 emerges at the fracture sidewall 4 within the scribed track 5 running in the direction of the fracture sidewall 4. The scribed track 5 is required in order to break the semiconductor chip—originally situated in the wafer composite—along the fracture sidewall 4, and thus to be able to separate it from the wafer composite. The contact area 3 applied on the underside of the semiconductor chip 1 is bounded by insulation layer regions 6. The semiconductor chip 1 is soldered on the conductor 7, which is of planar design, by means of a solder 8. In practice, it often happens that the solder 8 rises up or forms a bead 9 at the fracture sidewalls of the semiconductor chip or else in the scribed tracks 5, as illustrated by way of example in FIG. 3. This can cause a short circuit of the active layer 2 with the conductor 7 and/or the contact area 3, which may consequently entail a defect in the entire electronic circuit comprising the soldered-in semiconductor chip.

A previously known solution approach to this problem is shown in FIG. 3. In this case, in order to avoid a short circuit, a comparatively complicated deep etching is provided in the region of a scribed track 5, by means of which about 10 $\mu$m of the material of the semiconductor chip is removed in order to ensure that the end of the active layer 2 is covered by the insulation layer 6, which is applied after the deep etching in the wafer composite. This deep etching leads to considerable costs and difficulties in the wafer process since all other regions of the semiconductor chips situated in the wafer composite have to be covered. Finally, even in spite of this expensive and complicated etching operation, with this type of semiconductor chips, short circuits of active layers with the solder have been observed.

The invention is based on the object of providing a semiconductor chip and a method for fabricating it in which a hazard to the semiconductor circuit through the formation of short circuits can be precluded in a structurally simple and therefore cost-effective manner.

This object is achieved by means of a semiconductor chip according to claim 1 and a method according to claim 6.

According to the invention, at least one fracture-sidewall section which is assigned to the end of the active layer is provided with a passivation layer covering said section.

In this case, in a preferred embodiment of the invention, the passivation layer is formed by chemical conversion, in particular oxidation, of the starting material of the fracture sidewall and/or of that region of the active layer itself which ends at the fracture sidewall.

This oxidation is preferably carried out by means of a furnace process in the region of the fracture sidewall running at a lateral edge region. It is advantageous to carry out the oxidation in the furnace process through oxygen plasma or through water vapor at elevated temperature. It is advantageous in this case that no aqueous solution is used in the furnace process; the resulting electrically insulating passivation layer made of the oxidized semiconductor material therefore remains in the region of the fracture sidewall.

Further advantageous developments emerge from the subclaims.

The invention is explained in more detail below using a number of exemplary embodiments illustrated in the drawing. In detail, in the schematic illustrations:

FIG. 3 shows a schematic cross section through a further previously known semiconductor laser chip.

Figure 1:
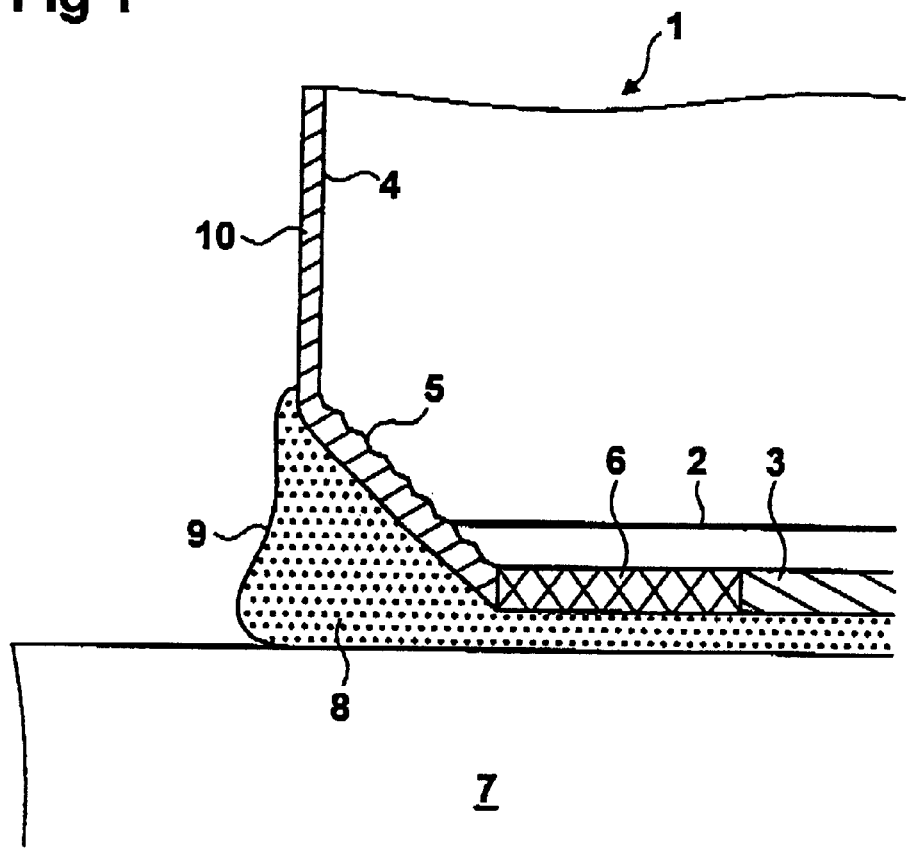
FIG. 1 shows a schematic cross section through a semiconductor laser chip.
Figure 2:
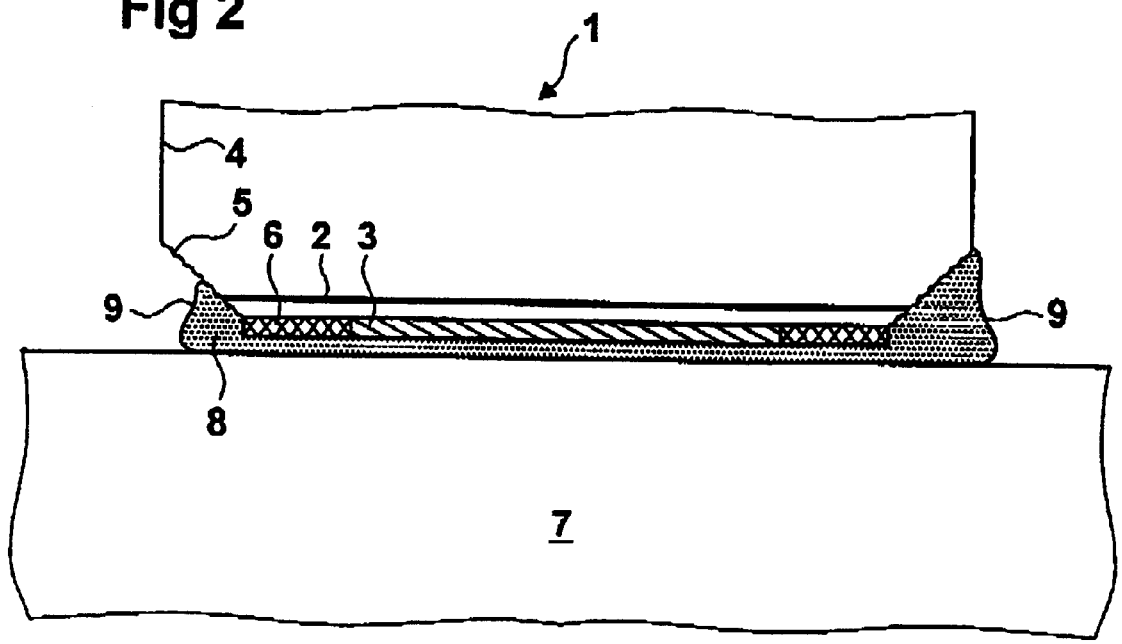
FIG. 2 shows a schematic cross section through a previously known semiconductor laser chip.

In FIG. 1, the same reference numerals from FIGS. 2 and 3 designate the same or equivalent component parts.

FIG. 1 shows a semiconductor chip 1 according to the invention, having an active layer 2—a laser layer—formed in the semiconductor substrate, which active layer is assigned a contact area 3 and ends laterally at the side of the fracture side wall 4 and emerges in the region of the scribed track 5 running in the direction of the fracture sidewall 4. A contact area 3 is applied on the underside of the semiconductor chip 1, said contact area being bounded by insulation layer regions 6 formed from $Si_3N_4$, $Al_2O_3$ or a similar electrically insulating material. Furthermore, a passivation layer can be seen which is in the form of an oxide layer 10 in the region of the end of the active layer 2 and of the scribed track 5 for covering the sensitive regions of the side of the fracture sidewall 4. This oxide layer 10 may be applied on the individual semiconductor chips, after the wafer has been divided into said chips, by means of oxidation, of the substrate essentially composed of GaAlAs, for example.

Consequently, the solder 8 used to solder the semiconductor chip 1 on the conductor 7 of planar design, said solder being formed into a bead 9, for example, in the region of the scribed track 5, can no longer lead to a short circuit of the active layer 2 with the conductor 7 and/or the contact area 3.

What is claimed is:

1. A semiconductor chip, comprising:
    a chip body formed with a fracture sidewall running at a lateral edge region;
    an electrically active layer ending at said fracture sidewall; and
    a passivation layer covering at least one fracture-sidewall segment at an end of said active layer.

2. The semiconductor chip according to claim 1, wherein said passivation layer is formed by chemical conversion of at least one of a starting material of said fracture sidewall and a region of said active layer ending at said fracture sidewall.

3. The semiconductor chip according to claim 1, wherein the chemical conversion is oxidation.

4. The semiconductor chip according to claim 1, wherein said chip body is formed of a base material of gallium-aluminum-arsenic (GaAlAs).

5. The semiconductor chip according to claim 1, wherein said chip body is formed with a fixing area on a lower region thereof.

6. The semiconductor chip according to claim 1, wherein the semiconductor chip is an optoelectronic component, and said active layer is connected to a conductor via a contact area assigned thereto (p-down mounting).

7. The semiconductor chip according to claim 6, wherein the semiconductor chip is a laser component.

8. The semiconductor chip according to claim 6, wherein the optoelectronic component is a linear array of lasers selected from the group consisting of power lasers and high-power lasers.

9. In a method of fabricating a semiconductor chip formed with a fracture sidewall running at a lateral edge region, and having an electrically active layer ending at the fracture sidewall, the improvement which comprises providing at least a fracture-sidewall segment adjacent to an end of the active layer with a passivation layer covering the segment.

10. The method according to claim 9, wherein providing step comprises at least partially passivating the semiconductor chip in a furnace process at the fracture sidewall running at a lateral edge region.

11. The method according to claim 10, wherein the passivating step comprises oxidizing those regions of the semiconductor chip to be passivated.

12. The method according to claim 11, which comprises oxidizing one of a starting material of the fracture sidewall and the region of the active layer that ends at the fracture sidewall.

13. The method according to claim 10, which comprises oxidizing in the furnace process through oxygen plasma.

14. The method according to claim 10, which comprises oxidizing in the furnace process through water vapor at elevated temperature.

15. A laser diode, comprising:
    a semiconductor chip having:
        a fracture sidewall running at a lateral edge region and having sections;
        an electrically active layer having ends and ending at said fracture sidewall;
        at least one said section coupled to an end of said active layer;
        a passivation layer covering said section, said passivation layer being formed by chemical conversion;
        said active layer having a region ending at said fracture sidewall;
        a solder and a contact surface connected to said layer by said solder; and
    a conductor being connected with said layer via said contact surface.

16. The laser diode according to claim 15, wherein said semiconductor chip has a base material of gallium-aluminum-arsenic (GaAlAs).

17. The laser diode according to claim 15, wherein said passivation layer is formed by oxidation of a starting material of said fracture sidewall.

18. A power laser diode, comprising:
    a semiconductor chip having:
        a fracture sidewall running at a lateral edge region and having sections;
        an electrically active layer having ends and ending at said fracture sidewall;
        at least one said section coupled to an end of said active layer;
        a passivation layer covering said section, said passivation layer being formed by chemical conversion;
        said active layer having a region ending at said fracture sidewall;
        a solder and a contact surface connected to said layer by said solder; and
    a conductor being connected with said layer via said contact surface.

19. A high power laser diode, comprising:
    a semiconductor chip having:
        a fracture sidewall running at a lateral edge region and having sections;
        an electrically active layer having ends and ending at said fracture sidewall;
        at least one said section coupled to an end of said active layer;
        a passivation layer covering said section, said passivation layer being formed by chemical conversion;
        said active layer having a region ending at said fracture sidewall;
        a solder and a contact surface connected to said layer by said solder; and
    a conductor being connected with said layer via said contact surface.

20. A method for fabricating a laser diode constructed as a semiconductor chip, the method which comprises:
    forming a fracture sidewall running at a lateral edge region;
    providing a laser-active layer ending at the fracture sidewall, connecting the layer with a conductor via a contact surface, and connecting the layer via a solder to the contact surface;
    passivating a plurality of regions of the laser diode in a furnace process through one of oxygen plasma and water vapor at elevated temperature techniques; and
    oxidizing a starting material of one of the fracture sidewall and a region of the active layer ending at the fracture sidewall.

* * * * *

UNITED STATES PATENT AND TRADEMARK OFFICE
CERTIFICATE OF CORRECTION

PATENT NO.     : 6,538,302 B1                                    Page 1 of 1
DATED          : March 25, 2003
INVENTOR(S)    : Karl-Heinz Schlereth It is certified that error appears in the above-identified patent and that said Letters Patent is hereby corrected as shown below:

Column 3,
Line 18, should read as follows: -- The semiconductor chip according to claim 2, wherein the chemical conversion is oxidation. --

Signed and Sealed this

Seventh Day of October, 2003

JAMES E. ROGAN
*Director of the United States Patent and Trademark Office*